United States Patent
Huang et al.

(10) Patent No.: US 10,890,616 B2
(45) Date of Patent: Jan. 12, 2021

(54) SELF-CHECK SYSTEM AND METHOD THEREOF

(71) Applicant: NUVOTON TECHNOLOGY CORPORATION, Hsinchu (TW)

(72) Inventors: Chih-Kai Huang, Zhubei (TW); Ping-Ying Chu, Hsinchu (TW); Chih-Shien Yang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 49 days.

(21) Appl. No.: 16/375,097

(22) Filed: Apr. 4, 2019

(65) Prior Publication Data
US 2020/0110130 A1    Apr. 9, 2020

(30) Foreign Application Priority Data
Oct. 8, 2018   (TW) .............................. 107135449 A (51) Int. Cl.
| G01R 31/28 | (2006.01) |
| H03K 7/08 | (2006.01) |
| H03M 1/12 | (2006.01) |

(52) U.S. Cl.
CPC ....... *G01R 31/2827* (2013.01); *G01R 31/281* (2013.01); *G01R 31/2803* (2013.01); *H03K 7/08* (2013.01); *H03M 1/12* (2013.01)

(58) Field of Classification Search
CPC .............. G01R 31/2827; G01R 31/281; G01R 31/2803; H03K 7/08; H03M 1/12; G06F 11/2273

USPC ......................................... 324/500, 537, 538
See application file for complete search history.

(56) References Cited

U.S. PATENT DOCUMENTS

| 6,011,502 A * | 1/2000 | Kao | ...................... H03M 1/147 341/154 |
| 6,028,545 A * | 2/2000 | Chen | ...................... H03M 1/144 341/156 |
| 6,445,329 B1 * | 9/2002 | Abassi | .................. H03M 1/145 331/17 |

* cited by examiner

*Primary Examiner* — Giovanni Astacio-Oquendo
(74) *Attorney, Agent, or Firm* — Muncy, Geissler, Olds & Lowe, P.C.

(57) ABSTRACT

A self-check system and a method thereof are disclosed. In the self-check system, a memory stores a safety check program, a main application program and a predetermined checksum data. The safety check program include a circuit check program, a watchdog circuit reset program and a checksum check program. When a chip system is powered on, a processing unit executes the main application program, and then executes an interrupt call to generate an interrupt, so as to execute the safety check program and the circuit check program to check a to-be-checked circuit. The processing unit also executes the watchdog circuit reset program to reset a counting value of a watchdog circuit. The processing unit also executes the checksum check program to calculate a checksum data of the first safety check program, and reset the chip system when the calculated checksum data is not equal to the predetermined checksum data.

11 Claims, 7 Drawing Sheets

SELF-CHECK SYSTEM AND METHOD THEREOF

CROSS-REFERENCE TO RELATED APPLICATION

This application claims the benefit of Taiwan Patent Application No. 107135449, filed on Oct. 8, 2018, in the Taiwan Intellectual Property Office, the disclosure of which is incorporated herein in its entirety by reference.

BACKGROUND OF THE INVENTION

1. Field of the Invention

The present invention relates to a check system, more particularly to a system capable of ensuring self-check operation of a micro control chip, and a method thereof.

2. Description of the Related Art

When a micro control chip used to control power has false action or malfunction, it easily occurs excessive current to cause danger, such as, burn, fire or explosion. For this reason, in the industry, there is a related organization for regulating a safety check standard, such as IEC60730, and the micro control chip manufacturers are required to provide related documents for demonstrating that their micro control chips meet the safety check standard before delivery. For example, the manufacturer must provide documents related to the program contents inside the micro-controller unit and description of execution process of safe check program, so as to ensure that important systemic circuits of the micro control chip can be periodically checked for safety during operation, and the micro control chip can stop operating in time when the systemic circuit has false action or malfunction, thereby preventing occurrence of danger.

As a result, every time the software or hardware of the micro control chip is updated, the manufacturer must again provide documents related to details of the programs inside the micro-controller unit and description of execution process, and it causes large burdens of the chip manufacturers. Therefore, what is needed is to provide a self-check system which is able to ensure the micro control chip to execute the safety check program periodically during operation and enable the safety standard organization to easily inspect the self-check scheme of the micro control chip.

SUMMARY OF THE INVENTION

In order to solve the above-mentioned problem, the present invention provides a self-check system and a method thereof.

According to an embodiment, a self-check system can be adapted to a chip system comprising at least one to-be-checked circuit and a reset circuit, and the self-check system comprises a memory, a watchdog circuit, and a processing unit. The memory is configured to store a first safety check program, a main application and a preset checksum data. The first safety check program comprises a circuit check program, a watchdog circuit reset program and a checksum check program. The main application comprises an interrupt call, and the preset checksum data corresponds to the first safety check program. After the watchdog circuit is activated, the watchdog circuit starts counting a counting value, and when the counting value overflows, the watchdog circuit triggers the reset circuit to reset the chip system. After the chip system is powered on, the processing unit executes the main application and executes the interrupt call to generate an interrupt, so as to execute the first safety check program. When the processing unit executes the first safety check program, the processing unit also executes the circuit check program to check the to-be-checked circuit. When the processing unit executes the first safety check program, the processing unit also executes the watchdog circuit reset program to reset the counting value of the watchdog circuit. When the processing unit executes the first safety check program, the processing unit executes the checksum check program to calculate checksum data of the first safety check program, when the calculated checksum data is not equal to the preset checksum data, the processing unit triggers the reset circuit to reset the chip system or notifies the main application.

According to an embodiment, the self-check system can comprise a register which stores an execution flag. The first safety check program comprises a flag clearing program, and the main application comprises a second safety check program and a flag setting program. After the processing unit executes the main application, the processing unit can execute the second safety check program to check the to-be-checked circuit, and also execute the flag setting program to set the execution flag of the register, and when the processing unit executes the first safety check program, the processing unit also executes the flag clearing program to check whether the execution flag is set.

According to an embodiment, when the processing unit executes the flag clearing program and confirms that the execution flag is not set, the processing unit triggers the reset circuit to reset the chip system or notifies the main application.

According to an embodiment, when the processing unit executes the flag clearing program and confirms that the execution flag is set already, the processing unit cleans the execution flag.

According to an embodiment, the memory is divided into a security protection read only memory (SPROM) and an application read only memory (APROM), the first safety check program is stored in the SPROM, and the main application is stored in the APROM.

According to an embodiment, the to-be-checked circuit comprises a system clock circuit, and the self-check system checks whether a clock signal outputted from the system clock circuit is correct.

According to an embodiment, the at least one to-be-checked circuit comprises an analog-to-digital converting circuit, and the self-check system checks whether an output digital value of the analog-to-digital converting circuit is correct.

According to an embodiment, the at least one to-be-checked circuit comprises a pulse width modulation (PWM) circuit, and the self-check system checks whether a PWM signal outputted from the PWM circuit is correct.

According to an embodiment, when the at least one to-be-checked circuit does not pass a check operation, the processing unit triggers the reset circuit to reset the chip system or notifies the main application.

According to an embodiment, the present invention provides a self-check method adapted to a chip system which comprises at least one to-be-checked circuit and a reset circuit. The self-check method comprises steps of storing a first safety check program, a main application and a preset checksum data in a memory, wherein the first safety check program comprises a circuit check program, a watchdog circuit reset program and a checksum check program, and the main application comprises an interrupt call, and the preset checksum data corresponds to the first safety check program; disposing a watchdog circuit, wherein after the chip system is powered on, the watchdog circuit is activated to start counting; after the chip system is powered on, executing the main application, and executing the interrupt call to generate an interrupt, so as to execute the first safety check program to execute the circuit check program to check the to-be-checked circuit, and execute the watchdog circuit reset program to reset the counting value of the watchdog circuit, and execute the checksum check program to generate checksum data of the first safety check program, wherein when the calculated checksum data is not equal to the preset checksum data, the reset circuit is triggered to reset the chip system or the main application is notified.

According to an embodiment, the self-check method further comprises steps of providing a register which stores an execution flag, wherein the first safety check program comprises a flag clearing program, and the main application comprises a second safety check program and a flag setting program, and when the main application is executed, the second safety check program is executed to check the to-be-checked circuit, and the flag setting program is executed to set the execution flag of the register, and when the first safety check program is executed, the flag clearing program is executed to check whether the execution flag is set.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

In an application of a specific chip such as a micro control chip for controlling power, if the specific chip has false action or malfunction, it easily occurs excessive current to cause danger. For this reason, in the industry, there is an organization for regulating a safety check standard such as IEC60730, and the micro control chip manufacturers are required to provide documents for demonstrating that the micro control chips meet the standard before delivery. For example, the manufacturer must provide documents related to the program contents inside the micro-controller unit and description of execution process of a safety check program, to demonstrate that the micro control chip is able to periodically check the systemic environment for safety during operation, and is able to stop operating in time when at least one important circuit has false action or malfunction, thereby preventing occurrence of danger.

The self-check system of the present invention is developed to ensure that the safety check program is stored in a memory and the chip system can periodically execute the safety check program during operation.

Figure 1:
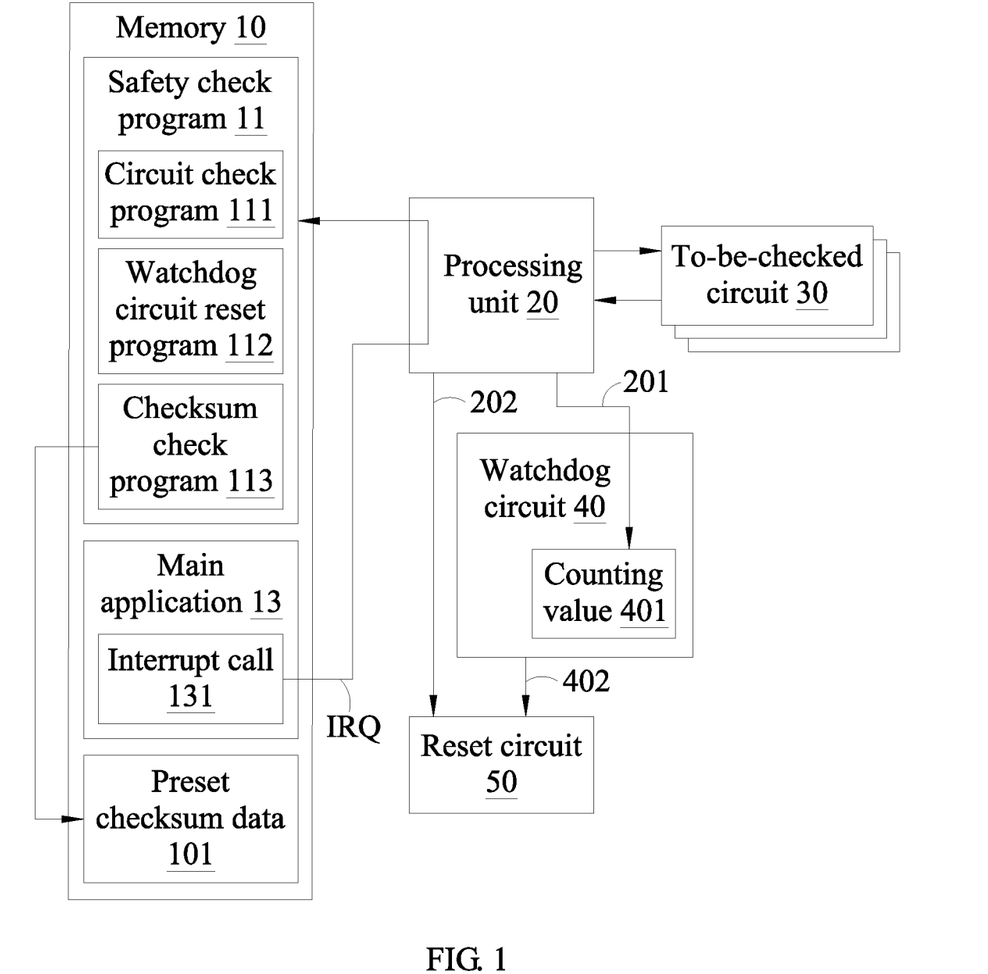
FIG. 1 is a block diagram of an embodiment of a self-check system of the present invention.

Please refer to FIG. 1, which shows a block diagram of an embodiment of a self-check system of the present invention. The self-check system is applicable to a chip system comprises at least one to-be-checked circuit 30 and a reset circuit 50. The self-check system comprises a memory 10, a watchdog circuit 40, and a processing unit 20.

The memory 10 stores a safety check program 11, a main application 13 and a preset checksum data 101. In an embodiment, the memory 10 can be a nonvolatile memory such as a flash memory or an EEPROM. The safety check program 11 can comprise a circuit check program 111, a watchdog circuit reset program 112 and a checksum check program 113. The storage location of the safety check program 11 corresponds to a hardware interrupt such as IRQ 10, so that the processing unit 20 can execute the safety check program 11 upon receipt of the predetermined hardware interrupt.

The main application 13 comprises an interrupt call 131 and a main function program. In general, after the chip system is powered on, the processing unit 20 executes the main application 13 to provide the predominant function of the chip system. In the self-check system of the present invention, the main application 13 is required to include the interrupt call for requesting, for example, IRQ 10, so that the processing unit 20 can periodically receive the specific hardware interrupt to execute the safety check program 11 when executing the main application 13.

The preset checksum data 101 corresponds to the safety check program 11. That is, the user can calculate the checksum of the safety check program 11 in advance, and store the calculated checksum in the memory 10 as the preset checksum data 101. The manner of calculating and checking checksum data is well known by a person having ordinary skill in the art, so the detailed description is not repeated herein.

The watchdog circuit 40 can be implemented by a timer hardware. The watchdog circuit 40 can comprise a counting value 401. After the watchdog circuit 40 activates, the watchdog circuit 40 starts counting the counting value 401, and when the counting value 401 overflows, the watchdog circuit 40 generates the trigger signal. In order to prevent generation of the trigger signal, the counting value 401 of the watchdog circuit 40 must be periodically reset. In the self-check system of the present invention, the trigger signal 402 of the watchdog circuit 40 is configured to trigger the reset circuit 50 for resetting the chip system; or, in an embodiment, the trigger signal 402 of the watchdog circuit 40 is configured to set an error flag to notify the main application 131.

After the chip system is powered on, the processing unit 20 executes the main application 13, and then executes the interrupt call 131 to generate the interrupt, thereby executing the safety check program 11. When the processing unit 20 executes the safety check program 11, the processing unit 20 can execute the circuit check program 111 to check the at least one to-be-checked circuit 30, and the processing unit 20 also execute the watchdog circuit reset program 112 to generate the counting-value reset signal 201, so as to reset the counting value 401 of the watchdog circuit 40.

If the main application 13 does not generate the interrupt periodically to execute the safety check program 11 and the watchdog circuit reset program 112, the watchdog circuit 40 eventually overflow to generate a trigger signal 402 to the reset circuit 50, so as to reset the chip system. In this case, after the chip system is reset, the chip system is then reset again because the watchdog circuit 40 overflows eventually, it is obvious that this mechanism can effectively disable the operation of the chip system, which does not periodically execute the safety check program 11.

When the processing unit 20 executes the safety check program 11, the processing unit 20 also executes the checksum check program 113 to calculate the checksum data of the safety check program 11. When the calculated checksum data is not equal to the preset checksum data 101, the processing unit 20 generates the trigger signal 202 to trigger the reset circuit 50 to reset the chip system. In an embodiment, the processing unit 20 can set the error flag to notify the main application 131 when the calculated checksum data is not equal to the preset checksum data 101.

There are many micro control chip manufacturers and application developers in the micro control chip industry. The micro control chip manufacturer can provide micro control chips, fundamental driver programs and safety check programs, and the application developer can develop and program the application into the micro control chip. Therefore, how to confirm that the application developer indeed programs the safety check program into the micro control chip, and to also enable the safety standards organization to easily confirm that the safety check program is programmed in the micro control chip, is an key issue of ensuring safety of the chip system.

The micro-control-chip manufacturer can provide the preset checksum data 101 of the safety check program to the application developer and the safety standards organization in advance. If the application developer does not store the preset checksum data 101 in a preset position of the memory 10, the checksum check program 113 can determine that the calculated checksum data is not equal to preset checksum data 101, which should be stored in the preset position of the memory 10, and the processing unit 20 can trigger the reset circuit 50 to reset the chip system or can set the error flag to notify the main application 131 to perform corresponding countermeasures. As a result, the chip system without the safety check program 11 is unable to operate normally. Furthermore, the safety standards organization can check whether the preset checksum data 101 is stored in the preset position of the memory 10, to easily confirm the micro control chip programmed with the safety check program.

In an embodiment, the at least one to-be-checked circuit 30 can comprise a system clock circuit 31, and the self-check system can check whether a clock signal outputted from the system clock circuit 31 is correct. In an embodiment, the at least one to-be-checked circuit 30 can comprise an analog-to-digital converting circuit 32, and the self-check system can check whether an output digital value of the analog-to-digital converting circuit 32 is correct. In an embodiment, the at least one to-be-checked circuit 30 can comprise a pulse width modulation (PWM) circuit 33, and the self-check system can check whether an PWM signal outputted from the PWM circuit 33 is correct. When the at least one to-be-checked circuit 30 does not pass the check operation, the processing unit 20 can generate the trigger signal 202 to trigger the reset circuit 50 to reset the chip system or set the error flag to notify the main application. The detail of check operation will be described in paragraphs below.

Figure 2:
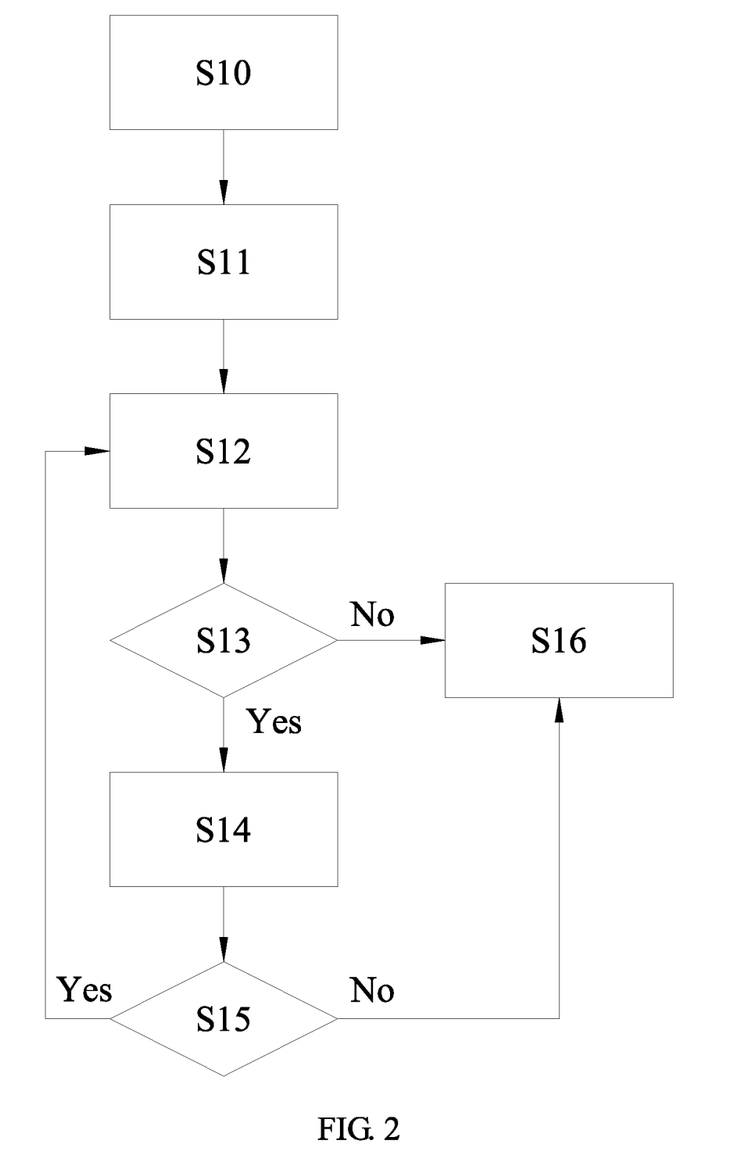
FIG. 2 is a flowchart showing the steps in an operation of an embodiment of a self-check method of the present invention.

Please refer to FIG. 2, which shows a flowchart showing the steps in an operation of an embodiment of a self-check method of the present invention. The self-check method is applicable to the chip system, such as the chip system shown in FIG. 1. The self-check method includes steps S11 to S16.

In the step S10, the safety check program 11, the main application 13 and the preset checksum data 101 are stored in a memory 10, and the safety check program 11 comprises the circuit check program 111, the watchdog circuit reset program 112, and the checksum check program 113. The main application 13 comprises the interrupt call 131. The preset checksum data 101 corresponds to the safety check program 11.

In the step S11, the watchdog circuit 40 is provided, and after the chip system is powered on, the watchdog circuit 40 is activated to start counting. In the step S12, after the chip system is powered on, the main application 13 is executed and the interrupt call 131 is also executed to generate the interrupt for executing the first safety check program 19.

In the step S13, the checksum check program 113 is executed to generate the checksum data of the first safety check program 19 and determine whether the calculated checksum data is equal to the preset checksum data 101. When the calculated checksum data is not equal to the preset checksum data 101, the method executes the step S16, the reset circuit 50 is triggered to reset the chip system; in an embodiment, the step S16 can be the step of setting the error flag to notify the main application 131. When the calculated checksum data is equal to the preset checksum data 101, the method executes the step S14.

In the step S14, the watchdog circuit reset program 112 is executed to reset the counting value 401 of the watchdog circuit 40. In the step S15, the circuit check program 111 is executed to check the at least one to-be-checked circuit 30. If the at least one to-be-checked circuit 30 does not pass the check operation, the method executes the step S16 to trigger the reset circuit 50 for resetting the chip system.

By using the self-check method of the present invention, if the application developer does not store the preset checksum data 101 in the preset position of the memory 10, and the checksum check program 113 determines that the calculated checksum data is not equal to the preset checksum data 101, and the processing unit 20 can trigger the reset circuit 50 to reset the chip system. As a result, the chip system without the safety check program 11 cannot operate normally. Furthermore, the safety standards organization can check whether the preset checksum data 101 is stored in the preset position of the memory 10, thereby easily confirming whether the micro control chip is programmed with the safety check program. Furthermore, if the main application 13 does not generate the interrupt periodically to execute the safety check program 11 and the watchdog circuit reset program 112, the watchdog circuit 40 eventually overflows to generate the trigger signal 402 to the reset circuit 50, so as to reset the chip system. After the chip system is power on again, the chip system is then reset eventually because the watchdog circuit 40 overflows eventually, it is obviously that this mechanism can disable the operation of the chip system, which does not periodically execute the safety check program 11.

The self-check method of the present invention can ensure that the safety check program 11 stored in the chip system, and the chip system periodically executes the safety check program 11 during operation; otherwise, operation of the chip system is stopped in time.

Figure 3:
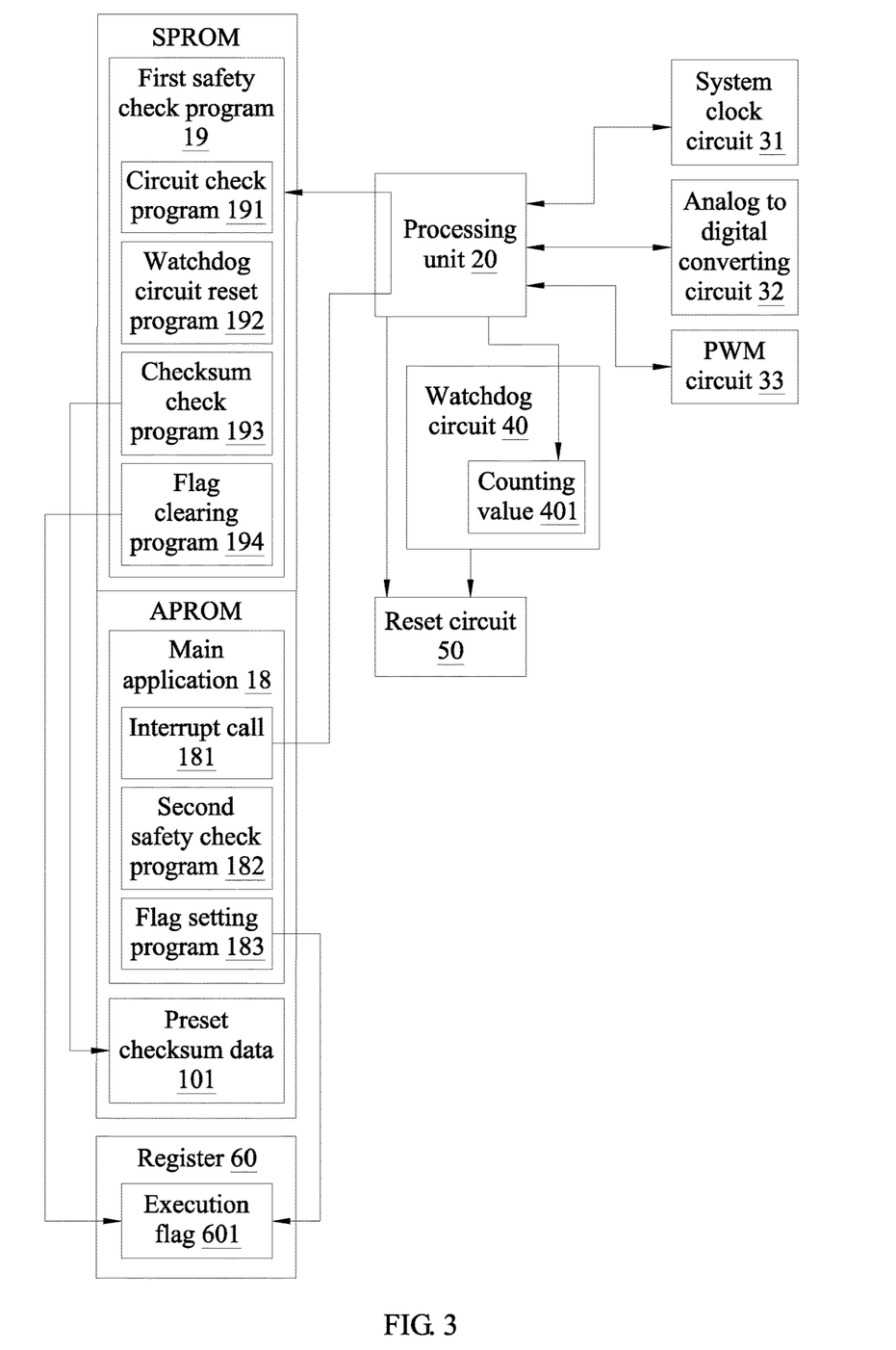
FIG. 3 is a block diagram of another embodiment of a self-check system of the present invention.

Please refer to FIG. 3, which shows a block diagram of another embodiment of a self-check system of the present invention. In the embodiment, the self-check system comprises a memory, a watchdog circuit 40, a processing unit 20 and a register 60. The memory stores a first safety check program 19, a main application 18 and a preset checksum data 101. The first safety check program 19 comprises a circuit check program 191, a watchdog circuit reset program 192, a checksum check program 193 and a flag clearing program 194. The main application 18 comprises a second safety check program 182, a flag setting program 183 and an interrupt call 181. The preset checksum data 101 corresponds to the first safety check program 19.

In the embodiment, the memory can be divided into an SPROM and an APROM. The SPROM is primarily used to store basic codes of the chip system, for example, driver codes. The programs developed by the application developer can be stored in the APROM. In the embodiment, the first safety check program 19 is stored in the SPROM, and the main application 13 is stored in the APROM. The chip system can comprise the system clock circuit 31, the analog-to-digital converting circuit 32, and the PWM circuit 33.

The difference between previous embodiment and this embodiment is that the safety check program of this embodiment includes a first safety check program 19 and a second safety check program 182, and the chip system comprises a register to check whether the second safety check program 182 is executed. In actual application, the micro-control-chip manufacturer can develop the first safety check program 19 which provides basic safety check functions, and the application developer can develop the second safety check program 182 to provide more safety check functions for the developed application. In an embodiment, when the safety check program developed by the micro control chip manufacturer is too large to store in the SPROM, the safety check program can be divided into the first safety check program 19 and the second safety check program 182, and the first safety check program 19 and the second safety check program 182 can be stored in the SPROM and the APROM, respectively.

After the chip system is powered on, the processing unit 20 executes the main application 18, and executes the interrupt call 181 to generate the interrupt, thereby executing the first safety check program 19. When the processing unit 20 executes the first safety check program 19, the processing unit 20 can execute the circuit check program 191 to check the at least one to-be-checked circuit 30, and the processing unit 20 also can execute the watchdog circuit reset program 192 and the checksum check program 193. The operations are the same as that of an embodiment shown in FIG. 1, so detailed descriptions are not repeated herein.

Furthermore, when the processing unit 20 executes the first safety check program 19, the processing unit 20 also executes the flag clearing program 194 to confirm whether the execution flag 601 is set as a preset value, such as "1"; if not, the processing unit 20 can trigger the reset circuit 50 to reset the chip system; or, in an embodiment, the processing unit 20 can set the error flag to notify the main application 131. When the processing unit 20 executes the flag clearing program 194 and confirms that the execution flag 601 is set as the preset value already, the processing unit 20 can clean the execution flag 601 to, for example, "0".

When the processing unit 20 executes the main application 18, the processing unit 20 can execute the second safety check program 182 to check the system clock circuit 31, the analog-to-digital converting circuit 32 and the PWM circuit 33, and also execute the flag setting program 183 to set the execution flag 601 of the register 60 as the preset value, such as "1".

In the embodiment, when the processing unit 20 executes the first safety check program 19, the processing unit 20 can confirm whether the execution flag 601 is set as "1", so as to determine whether the second safety check program 182 is executed already. In actual application, even the first safety check program 19 and the second safety check program 182 are programmed in the memory, the memory possibly is damaged after a long-term use, and the damaged memory fails to execute the second safety check program 182. For this reason, the aforementioned mechanism is required to ensure that the chip system can stop operating in time if the second safety check program 182 is not executed.

Figure 4:
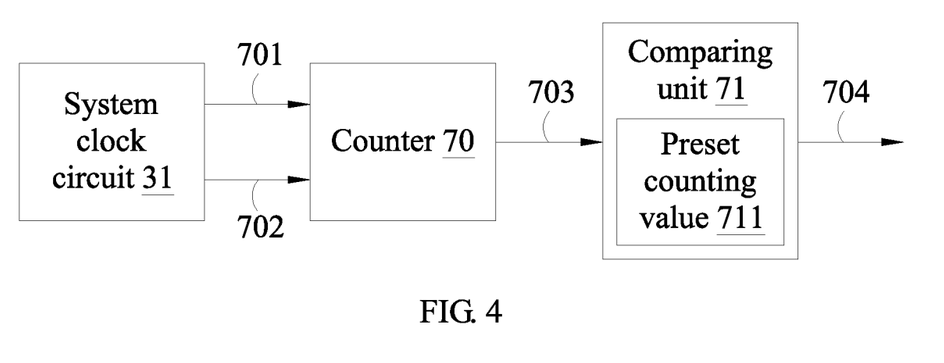
FIG. 4 is a schematic view of a check operation of a system clock circuit of the self-check system of the present invention.

Please refer to FIG. 4, which shows a schematic view of a check operation of a system clock circuit of a self-check system of the present invention. As shown in FIG. 4, the system clock circuit 31 generates at least two clock signals 701 and 702. In order to prevent the chip system operation error caused by a change in frequencies of the clock signals 701 and 702 due to environmental factor or damage of the system clock circuit, the self-check system of the present invention can periodically check whether the frequencies of the clock signals 701 and 702 is maintained in a certain ratio. As shown in FIG. 4, the counter 70 can receive the clock signals 701 and 702, and the clock signal with a higher frequency can serve as a counting reference signal, for example, the clock signal 701 is 1 MHz and the clock signal 702 is 48 MHz, the counter 70 can use the clock signal 702 to serve as the counting reference signal for counting the clock signal 701.

Since a ratio of the clock signal 701 to the clock signal 702 is preset, the clock signal 702 can count the clock signal 701 to obtain a counting value 703, and the comparing unit 71 can compare the counting value 703 with a preset counting value 711. When the difference between the counting value 703 and the preset counting value 711 is higher than a threshold value, the processing unit 20 can determine that the change in the frequencies of the clock signals 701 and 702 is too large, and then generate the trigger signal 202 to the reset circuit 50, so as to reset the chip system; or, in an embodiment, the processing unit 20 can set the error flag to notify the main application 131 to perform corresponding countermeasures.

Figure 5:
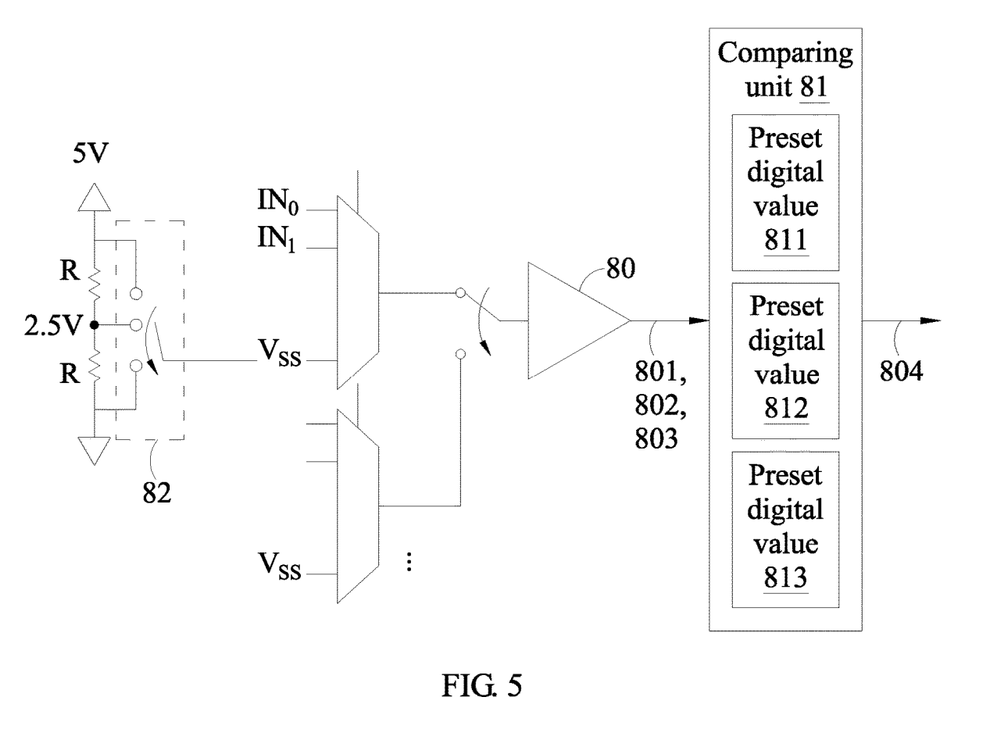
FIG. 5 is a schematic view of a check operation of an analog-to-digital converting circuit of a self-check system of the present invention.

Please refer to FIG. 5, which shows a schematic view of a check operation of an analog-to-digital converting circuit of a self-check system of the present invention. In order to check whether the analog-to-digital converting circuit 32 operates normally, the self-check system can comprise two resistors R and a switch 82 configured to input different voltages to the analog-to-digital convertor 80, respectively. The comparing unit 81 compares the output digital values 801 to 803, which are outputted from the analog-to-digital convertor 80, with the preset digital values 811 to 813, to generate output digital error values 804. For example, two resistors R can be electrically connected in series between a power source with a voltage of 5V and ground, so the output digital values 801 to 803 outputted from the analog-to-digital convertor 80 substantially correspond to 5V, 2.5V and 0V, respectively, and the preset digital values 811 to 813 also correspond to 5V, 2.5V and 0V, respectively. When one of the differences between the output digital values 801 to 803 and the preset digital values 811 to 813 is higher than a threshold value, the processing unit 20 can determine that the analog-to-digital converting circuit 32 has functional error, and then generate the trigger signal 202 to the reset circuit 50, so as to reset the chip system; or, in an embodiment, the processing unit 20 can set the error flag to notify the main application 131 to perform corresponding countermeasures.

Figure 6:
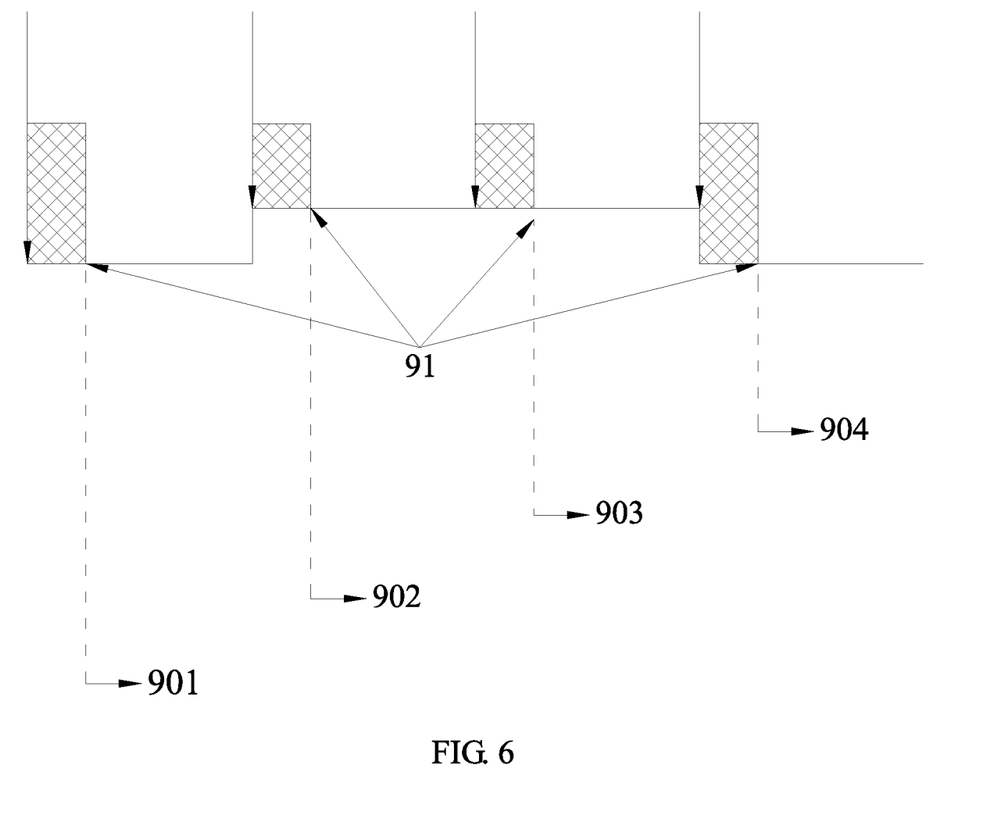
FIG. 6 is a schematic view of check operations of a pulse width modulation (PWM) circuit of a self-check system of the present invention.

Please refer to FIG. 6, which shows a schematic view of check operation of a PWM circuit of a self-check system of the present invention. When a check operation for the PWM circuit is performed, the sampling circuit 90 generates a preset sampling signal to sample a pulse width modulation signal of the chip system, and each sampling signal latch a latch time 91, to obtain a first sampling value 901, a second sampling value 902, a third sampling value 903 and a fourth sampling value 904. The processing unit 20 can determine whether the first sampling value 901, the second sampling value 902, the third sampling value 903 and the fourth sampling value 904 are the same as a preset pattern. When one of the first sampling value 901, the second sampling value 902, the third sampling value 903 and the fourth sampling value 904 is different from the preset pattern, the processing unit 20 can determine that the PWM circuit has functional error, and then generate the trigger signal 202 to the reset circuit 50, so as to reset the chip system; or, in an embodiment, the processing unit 20 can set the error flag to notify the main application 131 to perform corresponding countermeasures.

Figure 7:
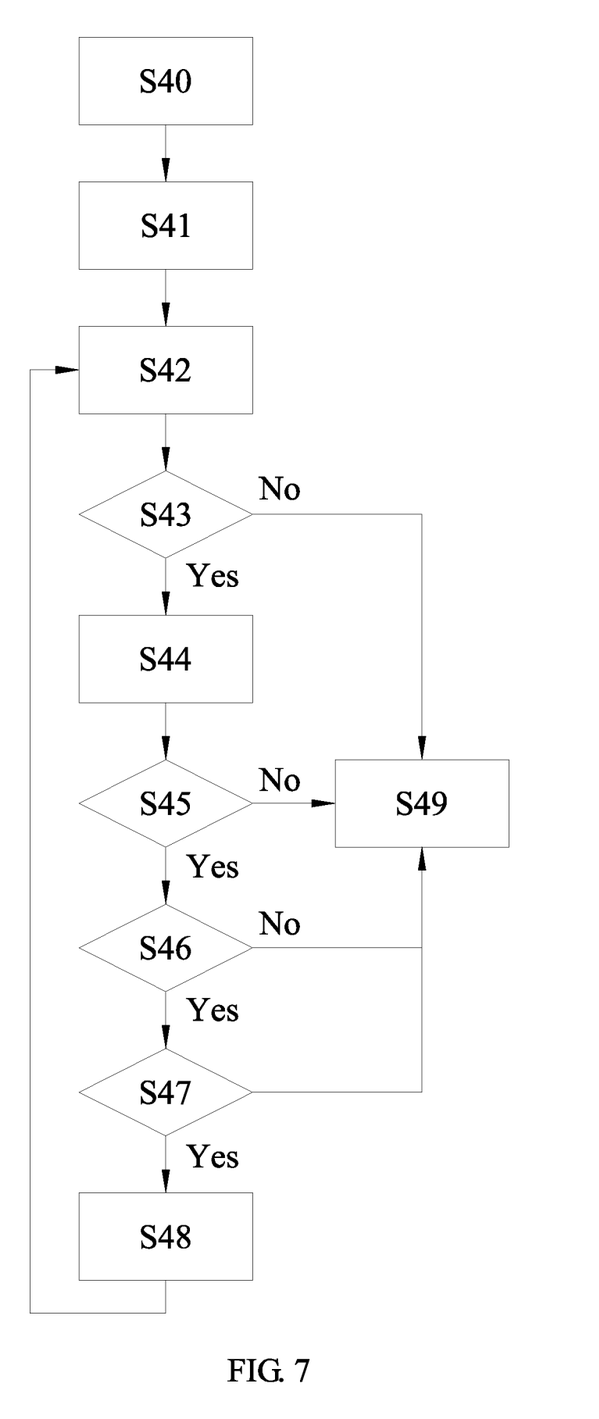
FIG. 7 is a flowchart showing the steps in an operation of another embodiment of a self-check method of the present invention.

Please refer to FIG. 7, which shows a flowchart showing the steps in an operation of another embodiment of a self-check method of the present invention. The self-check method is applicable to the chip system, such as the chip system shown in FIG. 3. The self-check method includes steps S40 to S49. In a step S40, the first safety check program 19, the main application 18 and the preset checksum data 101 are stored in a memory 10, and the first safety check program 19 comprises the circuit check program 191, the watchdog circuit reset program 192, the checksum check program 193 and the flag clearing program 194. The main application 13 comprises the interrupt call 131, and the preset checksum data 101 corresponds to the first safety check program 19.

In a step S41, a watchdog circuit 40 is provided, and after the chip system is powered on, the watchdog circuit 40 is activated to start counting.

In a step S42, after the chip system is powered on, the main application 13 is executed and the interrupt call 131 is also executed to generate the interrupt for executing the first safety check program 19. In a step S43, the checksum check program 193 is executed to generate the checksum data of the first safety check program 19 and determine whether the calculated checksum data is equal to the preset checksum data 101. When the calculated checksum data is not equal to the preset checksum data 101, the method executes a step S49, to trigger the reset circuit 50 to reset the chip system; in an embodiment, the step S49 can include an operation of setting the error flag to notify the main application 131. When the calculated checksum data is equal to the preset checksum data 101, the sequential step is executed.

In a step S44, the watchdog circuit reset program 112 is executed to reset the counting value 401 of the watchdog circuit 40. In a step S45, the flag clearing program is executed to check whether the execution flag 601 is set as the preset value such as "1"; if not, the method executes the step S49 to trigger the reset circuit 50 to reset the chip system. After the flag clearing program 194 is executed already, and it is confirmed that the execution flag 601 is set as "1", the execution flag 601 is cleaned to be, for example, "0".

In a step S46, the circuit check program 191 is executed to check the at least one to-be-checked circuit, such as the system clock circuit 31, the analog-to-digital converting circuit 32, or the PWM circuit. When one of the at least one to-be-checked circuit does not pass the check operation, the method executes the step S49 to trigger the reset circuit 50 to reset the chip system. When the at least one to-be-checked circuit passes the check operation, the method executes the step 47.

In a step S47, the second safety check program 182 is executed to check the at least one to-be-checked circuit, such as the system clock circuit 31, the analog-to-digital converting circuit 32, or the pulse width modulation (PWM) circuit. When the to-be-checked circuit does not pass the check operation, the method executes the step S49 to trigger the reset circuit 50 to reset the chip system; in an embodiment, the step S49 can include an operation of setting the error flag to notify the main application 131. When the to-be-checked circuit passes the check operation, the method executes the step 48 to execute the flag setting program 183 for setting the execution flag 601 as, for example, "1".

It should be noted that the first safety check program 19 and the second safety check program 182 are executed in the step S46 and the step S47, to check the to-be-checked circuit, respectively. If the to-be-checked circuit comprises a plurality of circuits such as the system clock circuit 31, the analog-to-digital converting circuit 32, and the PWM circuit, or the check time for the to-be-checked circuit is longer, the system designer can appropriately divide and allocate the check program into the first safety check program 19 and the second safety check program 182, and the allocation and division of the check program is not limited in the present invention. Furthermore, in a condition that a complete check operation needs longer time, in order to maintain normal operation of the chip system, the system designer can divide the whole check operation into multiple partial check operations, and execution of the multiple partial check operations can be completed by executing the first safety check program 19 and the second safety check program 182 for many times, so as to complete the whole check.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A self-check system, adapted to a chip system comprising at least one to-be-checked circuit and a reset circuit, and the self-check system comprising:
    a memory configured to store a first safety check program, a main application and a preset checksum data, wherein the first safety check program comprises a circuit check program, a watchdog circuit reset program and a checksum check program, and the main application comprises an interrupt call, and the preset checksum data corresponds to the first safety check program;
    a watchdog circuit comprising a counting value, wherein after the watchdog circuit is activated, the watchdog circuit starts counting the counting value, and when the counting value overflows, the watchdog circuit triggers the reset circuit to reset the chip system;
    a processing unit, wherein after the chip system is powered on, the processing unit executes the main application and executes the interrupt call to generate an interrupt, so as to execute the first safety check program;
    wherein when the processing unit executes the first safety check program, the processing unit executes the circuit check program to check the to-be-checked circuit;
    wherein when the processing unit executes the first safety check program, the processing unit executes the watchdog circuit reset program, to reset the counting value of the watchdog circuit;
    wherein when the processing unit executes the first safety check program, the processing unit executes the checksum check program to calculate checksum data of the first safety check program, when the calculated checksum data is not equal to the preset checksum data, the processing unit triggers the reset circuit to reset the chip system or notifies the main application.

2. The self-check system according to claim 1, further comprising a register which stores an execution flag, wherein the first safety check program comprises a flag clearing program, and the main application comprises a second safety check program and a flag setting program, after the processing unit executes the main application, the processing unit executes the second safety check program to check the to-be-checked circuit, and executes the flag setting program to set the execution flag of the register, and when the processing unit executes the first safety check program, the processing unit executes the flag clearing program to check whether the execution flag is set.

3. The self-check system according to claim 2, wherein when the processing unit executes the flag clearing program and confirms that the execution flag is not set, the processing unit triggers the reset circuit to reset the chip system.

4. The self-check system according to claim 2, wherein when the processing unit executes the flag clearing program and confirms that the execution flag is set already, the processing unit cleans the execution flag.

5. The self-check system according to claim 2, wherein the memory is divided into an SPROM and an APROM, the first safety check program is stored in the SPROM, and the main application is stored in the APROM.

6. The self-check system according to claim 1, wherein the to-be-checked circuit comprises a system clock circuit, and the first safety check program is executed to check whether a clock signal outputted from the system clock circuit is correct.

7. The self-check system according to claim 1, wherein the at least one to-be-checked circuit comprises an analog-to-digital converting circuit, and the first safety check program is executed to check whether an output digital value of the analog-to-digital converting circuit is correct.

8. The self-check system according to claim 1, wherein the at least one to-be-checked circuit comprises a pulse width modulation (PWM) circuit, the first safety check program is executed to check whether a PWM signal outputted from the PWM circuit is correct.

9. The self-check system according to claim 1, wherein when the at least one to-be-checked circuit does not pass a check operation of the first safety check program, the processing unit triggers the reset circuit to reset the chip system or notifies the main application.

10. A self-check method, adapted to a chip system which comprises at least one to-be-checked circuit and a reset circuit, and the self-check method comprising:
    storing a first safety check program, a main application and a preset checksum data in a memory, wherein the first safety check program comprises a circuit check program, a watchdog circuit reset program and a checksum check program, and the main application comprises an interrupt call, and the preset checksum data corresponds to the first safety check program;
    disposing a watchdog circuit, wherein after the chip system is powered on, the watchdog circuit is activated to start counting;
    after the chip system is powered on, executing the main application, and executing the interrupt call to generate an interrupt, so as to execute the first safety check program to execute the circuit check program to check the to-be-checked circuit, and execute the watchdog circuit reset program to reset the counting value of the watchdog circuit, and execute the checksum check program to generate checksum data of the first safety check program, wherein when the calculated checksum data is not equal to the preset checksum data, the reset circuit is triggered to reset the chip system.

11. The self-check method according to claim 10, further comprising:
    providing a register which stores an execution flag, wherein the first safety check program comprises a flag clearing program, and the main application comprises a second safety check program and a flag setting program, and when the main application is executed, the second safety check program is executed to check the to-be-checked circuit, and the flag setting program is executed to set the execution flag of the register, and when the first safety check program is executed, the flag clearing program is executed to check whether the execution flag is set.

* * * * *